(12) United States Patent
Wu

(10) Patent No.: US 11,232,997 B2
(45) Date of Patent: Jan. 25, 2022

(54) HEAT DISSIPATION MODULE AND ELECTRONIC DEVICE

(71) Applicant: Wistron Corporation, New Taipei (TW)

(72) Inventor: Huan-Chun Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/681,847

(22) Filed: Nov. 13, 2019

(65) Prior Publication Data
US 2021/0057306 A1 Feb. 25, 2021

(30) Foreign Application Priority Data

Aug. 23, 2019 (TW) ................................ 108211231

(51) Int. Cl.
| | |
|---|---|
| *H01L 23/473* | (2006.01) |
| *F28F 13/02* | (2006.01) |
| *H01L 23/467* | (2006.01) |
| *F28F 1/14* | (2006.01) |
| *F28F 1/12* | (2006.01) |
| *F28F 1/40* | (2006.01) |

(52) U.S. Cl.
CPC ............ *H01L 23/473* (2013.01); *F28F 13/02* (2013.01); *H01L 23/467* (2013.01); *F28F 1/124* (2013.01); *F28F 1/14* (2013.01); *F28F 1/40* (2013.01); *F28F 2245/02* (2013.01)

(58) Field of Classification Search
CPC ........ F25B 13/00; F25B 1/10; F25B 2400/13; F25B 2400/23; H05K 7/20809; H05K 7/20818; H05K 7/20772; H05K 7/20827; H05K 7/20745; H05K 7/2079; H05K 7/20272; H05K 7/20318; F28F 13/06; F28F 27/00; F28F 1/40; F28F 1/24; F28F 1/126; F28F 1/14; F28F 1/42; F28F 13/02; F28F 2245/02

See application file for complete search history.

(56) References Cited

U.S. PATENT DOCUMENTS

| | | | | |
|---|---|---|---|---|
| 2,961,476 A | * | 11/1960 | Maslin ..................... | H01F 27/18 174/15.1 |
| 3,402,761 A | * | 9/1968 | Swet ....................... | B64G 1/506 165/272 |
| 3,517,730 A | * | 6/1970 | Wyatt ...................... | F28D 15/06 165/272 |
| 3,604,503 A | * | 9/1971 | Feldman, Jr ......... | F28D 15/0241 165/96 |
| 3,933,198 A | * | 1/1976 | Hara ....................... | F25D 11/025 165/272 |

(Continued)

FOREIGN PATENT DOCUMENTS

TW M282479 12/2005

*Primary Examiner* — Adam B Dravininkas
(74) *Attorney, Agent, or Firm* — JCIPRNET

(57) ABSTRACT

A heat dissipation module including a heat dissipation portion, a working fluid, and a buffer member is provided. The heat dissipation portion has a containing portion, the working fluid is contained in the containing portion, and the buffer member is connected to the containing portion. When the working fluid is heated, the buffer member is expanded to maintain a constant pressure within the containing portion.

18 Claims, 7 Drawing Sheets

(56) References Cited

U.S. PATENT DOCUMENTS

| | | | | |
|---|---|---|---|---|
| 4,140,173 | A * | 2/1979 | Wulf | F28D 20/0034 165/104.14 |
| 4,799,537 | A * | 1/1989 | Hoke, Jr. | F28D 15/06 165/104.27 |
| 5,411,077 | A * | 5/1995 | Tousignant | F28D 15/02 165/104.33 |
| 5,765,284 | A * | 6/1998 | Ali | B21D 53/085 29/727 |
| 6,062,299 | A * | 5/2000 | Choo | F28D 15/00 165/104.21 |
| 6,675,887 | B2 * | 1/2004 | Garner | F28D 15/0275 165/104.14 |
| 6,770,085 | B1 * | 8/2004 | Munson | A61F 7/02 607/104 |
| 8,910,706 | B2 * | 12/2014 | Gilliland | F28F 23/00 165/276 |
| 8,937,383 | B2 * | 1/2015 | Laquer | H01L 23/44 257/712 |
| 9,464,854 | B2 * | 10/2016 | Shelnutt | H05K 7/20809 |
| 10,568,236 | B2 * | 2/2020 | Tian | H05K 7/203 |
| 2002/0118794 | A1 * | 8/2002 | McCarthy, Jr. | F25B 1/06 378/200 |
| 2003/0183381 | A1 * | 10/2003 | Garner | F28D 15/0275 165/274 |
| 2006/0007657 | A1 * | 1/2006 | Pfahnl | H05K 7/20327 361/700 |
| 2006/0039111 | A1 * | 2/2006 | Huang | H01L 23/427 361/698 |
| 2008/0116568 | A1 * | 5/2008 | Laquer | H01L 23/44 257/712 |
| 2012/0111538 | A1 * | 5/2012 | Wang | F28D 15/0266 165/104.21 |
| 2017/0280577 | A1 * | 9/2017 | Laneryd | F28D 1/022 |
| 2017/0295670 | A1 * | 10/2017 | Campbell | H05K 7/20236 |
| 2018/0020570 | A1 * | 1/2018 | Fujiwara | H05K 7/20418 |

* cited by examiner

HEAT DISSIPATION MODULE AND ELECTRONIC DEVICE

CROSS-REFERENCE TO RELATED APPLICATION

This application claims the priority benefit of Taiwan application serial no. 108211231, filed on Aug. 23, 2019. The entirety of the above-mentioned patent application is hereby incorporated by reference herein and made a part of this specification.

BACKGROUND

Technical Field

The present invention relates to a heat dissipation module and an electronic device, and in particular to a heat dissipation module with a buffer member and an electronic device adopting the heat dissipation module.

Description of Related Art

At present, the performance of central processing units (CPU) and graphic processing units (GPU) is more and more emphasized, and among them, Intel central processing units (Intel CPU) can be divided into two different types of turbos, i.e. a steady-state (PL1) turbo and a transient (PL2) turbo. In the process of the turbo, the efficiency of the central processing unit will be greatly increased, as a result, the central processing unit will produce a great deal of heat within a short time, and if the temperature of the central processing unit cannot be effectively decreased, the central processing unit may be unable to unleash the maximum efficacy thereof.

At present, immersion type heat dissipation devices are adopted to solve the problem on how to dissipate the heat of central processing units, and the immersion type heat dissipation devices dissipate heat by utilizing the principle that a great deal of heat can be absorbed by vaporizing liquid. However, under the condition that pressure increases, the boiling point of the liquid will increase rapidly, causing the liquid to be unable to boil, and as a result, the capability of heat dissipation will be decreased. Therefore, the existing immersion type heat dissipation devices require a large space to solve the problem of pressure change, and consequently, a modularized immersion type heat dissipation device cannot be produced.

SUMMARY

The present invention provides a heat dissipation module with a better heat dissipation effect.

The present invention further provides an electronic device, which includes the heat dissipation module and has better efficiency and reliability.

The heat dissipation module of the present invention includes a heat dissipation portion, a working fluid, and a buffer member. The heat dissipation portion has a containing portion, the working fluid is contained in the containing portion, and the buffer member is connected to the containing portion. When the working fluid is heated, the buffer part is expanded to maintain a constant pressure within the containing portion.

The electronic device of the present invention includes a mainboard, at least one heating component, and a heat dissipation module. The heating component is arranged on the mainboard and the heat dissipation module is arranged on the mainboard and is in contact with the heating component. The heat dissipation module includes a heat dissipation portion, a working fluid, and a buffer member. The heat dissipation portion has a containing portion, the working fluid is contained in the containing portion, and the buffer member is connected to the containing portion. When heat produced by the heating component is transferred to the heat dissipation module, the working fluid is heated, and the buffer member is expanded to maintain a constant pressure within the containing portion.

Based on the above, in the design of the heat dissipation module of the present invention, the buffer member is connected to the containing portion of the heat dissipation portion, and when the working fluid is heated, the buffer member is expanded to maintain a constant pressure within the containing portion. That is, the pressure in the containing portion is kept unchanged before and after the working fluid is heated. Thus, the problem of boiling point increasing of the working fluid as a result of drastic pressure change during vaporization can be mitigated, thereby increasing the heat dissipation efficiency of the heat dissipation module of the present invention. In addition, the electronic device which adopts the heat dissipation module of the present invention can have better efficiency and reliability as well.

To make the aforementioned and other features of the disclosure more comprehensible, several embodiments accompanied with drawings are described in detail as follows.

DESCRIPTION OF THE EMBODIMENTS

Figure 1A:
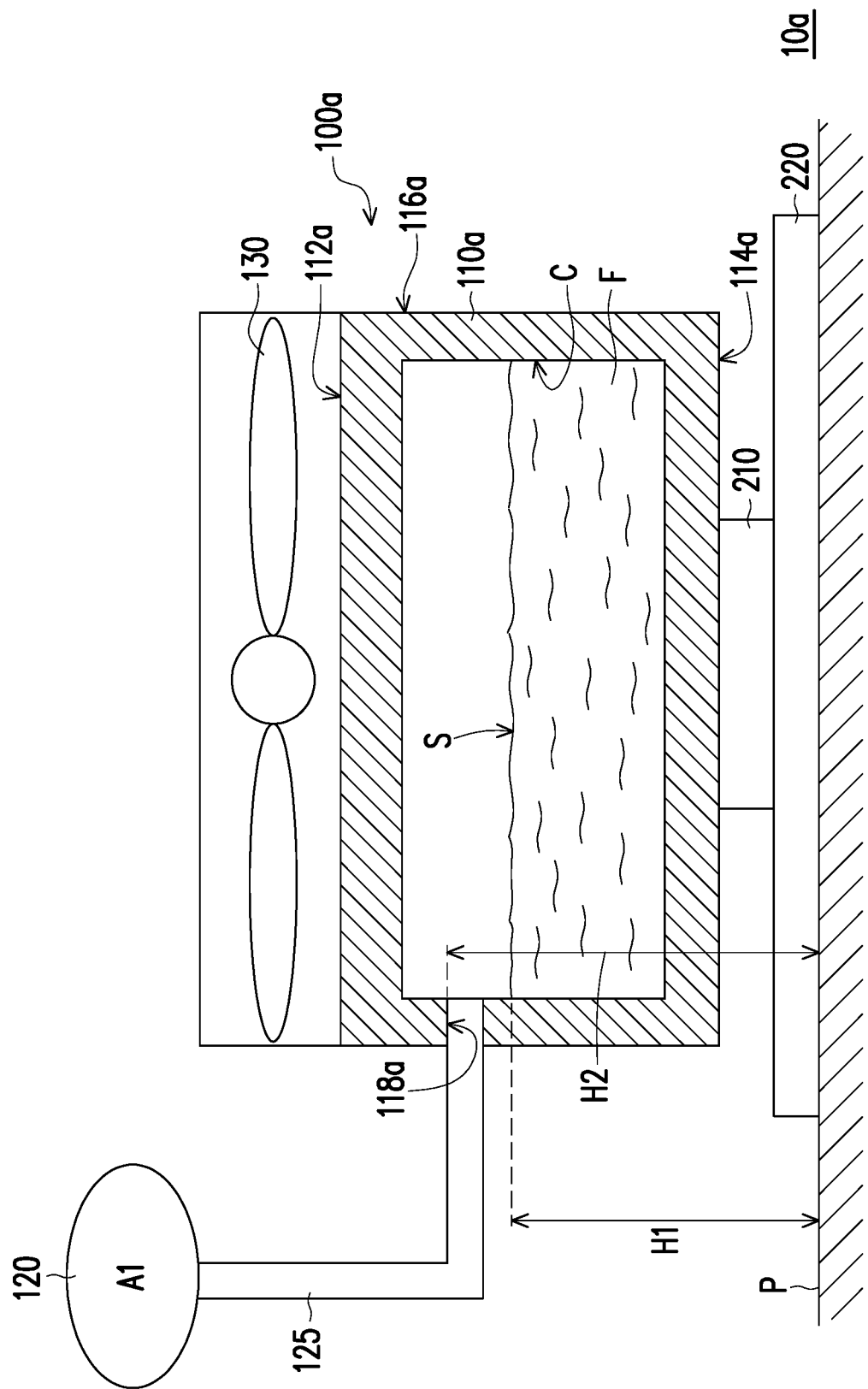
FIG. 1A is a schematic diagram of an electronic device according to an embodiment of the present invention.
Figure 1B:
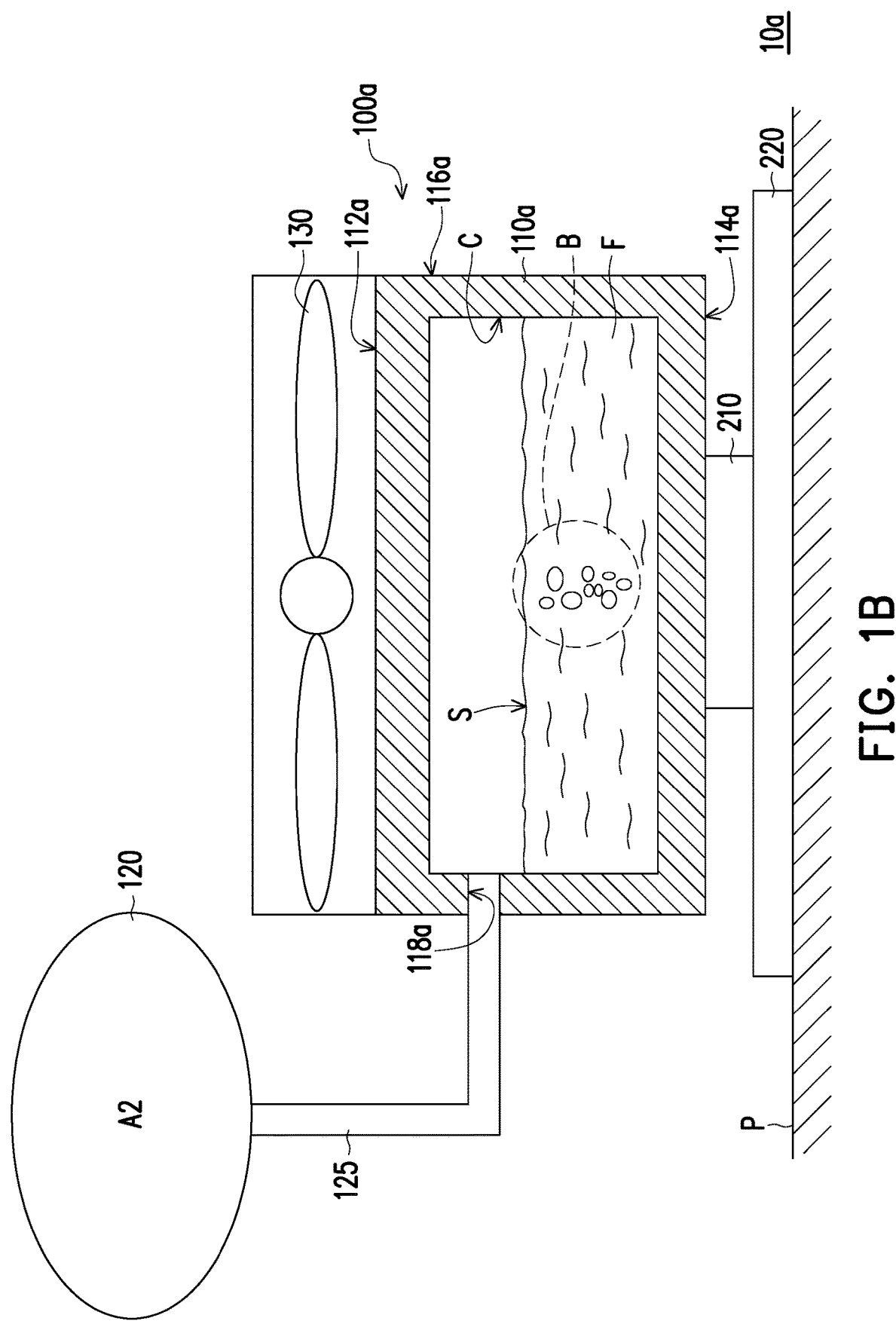
FIG. 1B is a schematic diagram of a buffer member expanding when a working fluid of a heat dissipation module in FIG. 1A is heated.

FIG. 1A is a schematic diagram of an electronic device according to an embodiment of the present invention. FIG. 1B is a schematic diagram of a buffer member expanding when a working fluid of a heat dissipation module in FIG. 1A is heated. Refer to both FIG. 1A and FIG. 1B, in the present embodiment, an electronic device 10a includes a heat dissipation module 100a, at least one heating component (only one heating component 210 is schematically depicted), and a mainboard 220. The heating component 210 is arranged on the mainboard 220 and the heat dissipation module 100a is arranged on the mainboard 220 and is in contact with the heating component 210. In addition, the heating component 210, for example, is a central processing unit or a graphic processing unit, but is not limited thereto.

Specifically, the heat dissipation module 100a of the present embodiment includes a heat dissipation portion 110a, a working fluid F, and a buffer member 120. The heat dissipation portion 110a has a containing portion C, the working fluid F is contained in the containing portion C, and the buffer member 120 is connected to the containing portion C. More specifically, the heat dissipation portion 110a of the present embodiment has a first surface 112a, a second surface 114a, and a peripheral surface 116a. The first surface 112a and the second surface 114a are opposite to each other, and the peripheral surface 116a connects the first surface 112a and the second surface 114a. The peripheral surface 116a is perpendicular to the first surface 112a and the second surface 114a, and the first surface 112a and the second surface 114a are parallel to a horizontally arranged surface P. Moreover, the heat dissipation portion 110a of the present embodiment has an opening 118a, the opening 118a is located in the peripheral surface 116a, and the buffer member 120 is connected to the containing portion C via the opening 118a. In addition, the heat dissipation module 100a of the present embodiment further includes a tube 125, which connects the buffer member 120 and the opening 118a. The buffer member 120, the tube 125, and the containing portion C form a closed space. Therefore, when heat produced by the heating component 210 is transferred to the heat dissipation module 100a, the working fluid F is heated, and the buffer member 130 is expanded from a first capacity A1 to a second capacity A2 to maintain a constant pressure within the containing portion C. That is, the pressure in the containing portion C is kept unchanged before and after the working fluid F is heated. Preferably, the pressure in the containing portion C is kept at, for example, one atmospheric pressure before and after the working fluid F is heated.

In particular, the design of the buffer member 120 of the present embodiment is configured to enlarge the space, so as to mitigate the problem of boiling point increasing as the result of drastic pressure change when the working fluid F is heated and vaporized. Pressure and temperature as well as the constant of converting particle number into the force of particles impacting a vessel are kept unchanged, obtaining a formula:

$$\Delta V = V\left[\frac{Tb\left(N + \frac{X}{Lh \times M}\right)}{N - Ta} - 1\right];$$

wherein, V represents the volume, Tb represents the temperature after heating (boiling point temperature), N represents the mole number of gas molecules, X represents the heat produced by heating component per second, Lh represents the latent heat (J/g), M represents the molecular weight of liquid, and Ta represents the initial temperature. Preferably, the amount of expansion and contraction of the buffer member 120 can at least accommodate 3ΔV of space, so that the gas pressure can be always kept at one atmospheric pressure within this interval.

In addition, the heat dissipation module 100a of the present embodiment further includes a heat dissipation component 130, which is arranged on the first surface 112a of the heat dissipation portion 110a, and wherein, the heat dissipation portion 110a is located between the heat dissipation component 130 and the heating component 210. In addition, the heat dissipation component 130, for example, is a fan, which is configured to dissipate the heat of the working fluid F. In other unshown embodiments, the heat dissipation component may also be a fin. As shown in FIG. 1A, a first vertical height H1 exists from a top surface S of the working fluid F to the horizontally arranged surface P, and a second vertical height H2 exists from the opening 118a to the horizontally arranged surface P, wherein the second vertical height H2 is greater than the first vertical height H1. That is, the containing portion C is not fully filled with the working fluid F within the containing portion C. At this point, the boiling point of the working fluid F is between 50° C. and 80° C., that is, the working fluid F is a low-boiling point fluid.

In another embodiment, the working fluid F may also be water. The characteristic that the specific heat of the working fluid F (i.e. liquid water with a specific heat of 4.184 J/g) is higher than that of metal (such as copper with a specific heat of 0.9 J/g; or aluminium with a specific heat of 0.38 J/g) is utilized to ensure that the temperature is only increased after the heat dissipation module 100a absorbs much more heat, thereby greatly increasing the thermal capacity of the solution for heat is. At this point, the specific heat of per gram of water is five times the specific heat of aluminium and eleven times the specific heat of copper. In addition, the characteristic that the latent heat of the low-boiling point working fluid F (i.e. liquid water) can bring away a great deal of heat during vaporization is utilized to bring away the heat produced by the heating component 210, so the heat dissipation effect is ten or more times higher than that of known forced convection.

In short, as the buffer member 120 of the present embodiment is connected to the containing portion C of the heat dissipation portion 110a, when the working fluid F is heated to boil to produce bubbles B, the buffer member 120 is expanded from the first capacity A1 to the second capacity A2, so that the pressure in the containing portion C can be kept unchanged before and after the working fluid F is heated. Thus, the problem of boiling point increasing of the working fluid F as the result of drastic pressure change during vaporization can be mitigated, thereby increasing the heat dissipation efficiency of the heat dissipation module 100a of the present embodiment. In addition, the electronic device 10a which adopts the heat dissipation module 100a of the present embodiment can have better efficiency and reliability as well.

It should be noted herein that the reference numerals of components and some contents in the foregoing embodiments also apply in the following embodiments, wherein the same reference numerals are used to denote the same or similar components, and the descriptions of the same technical contents are omitted. For the description of the omitted part, reference can be made to the foregoing embodiments, and the details are not described in the following embodiments again.

Figure 2A:
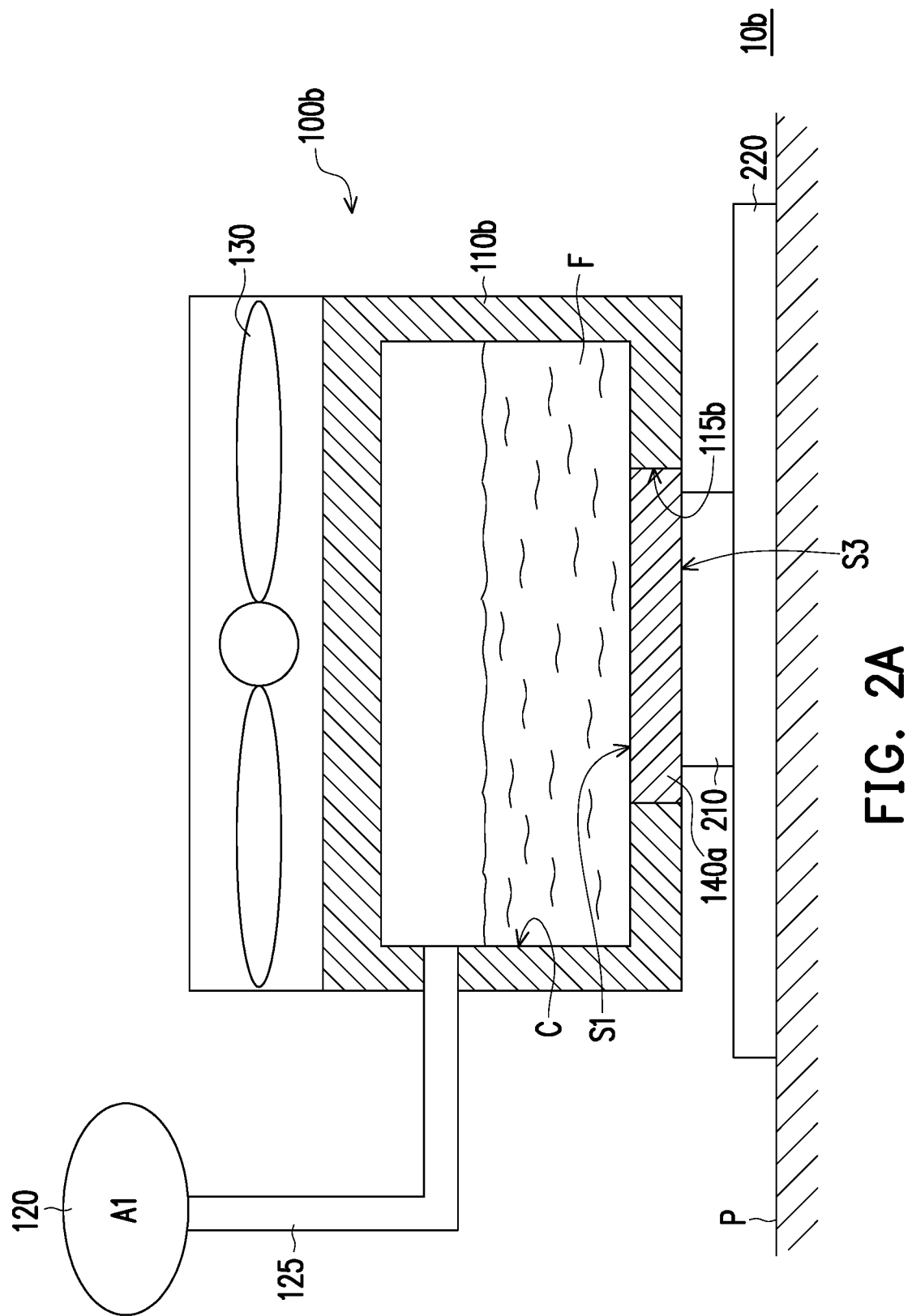
FIG. 2A is a schematic diagram of an electronic device according to another embodiment of the present invention.
Figure 2B:
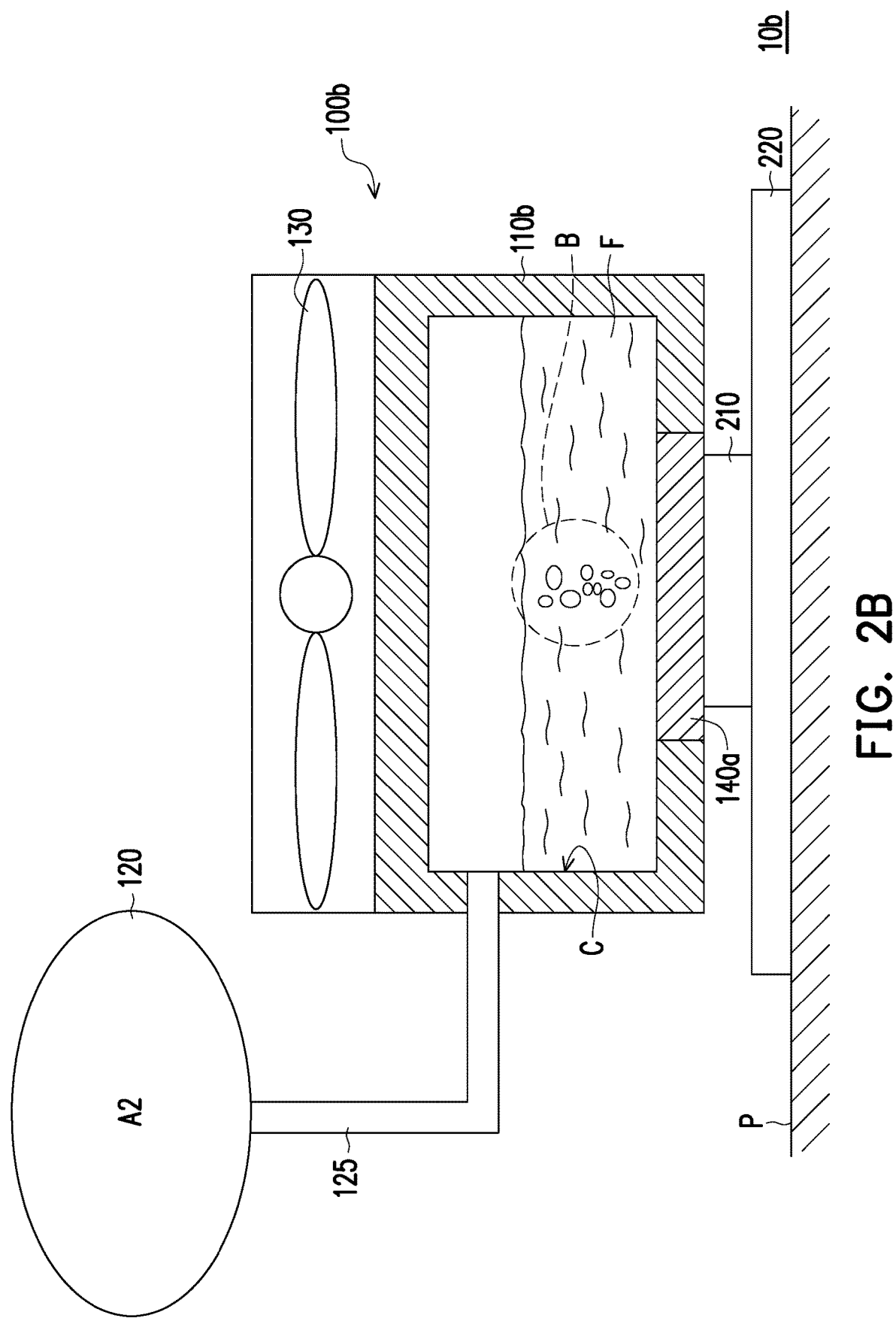
FIG. 2B and FIG. 2C are schematic diagrams of a buffer member expanding when a working fluid of a heat dissipation module in FIG. 2A is boiling and evaporating.
Figure 2C:
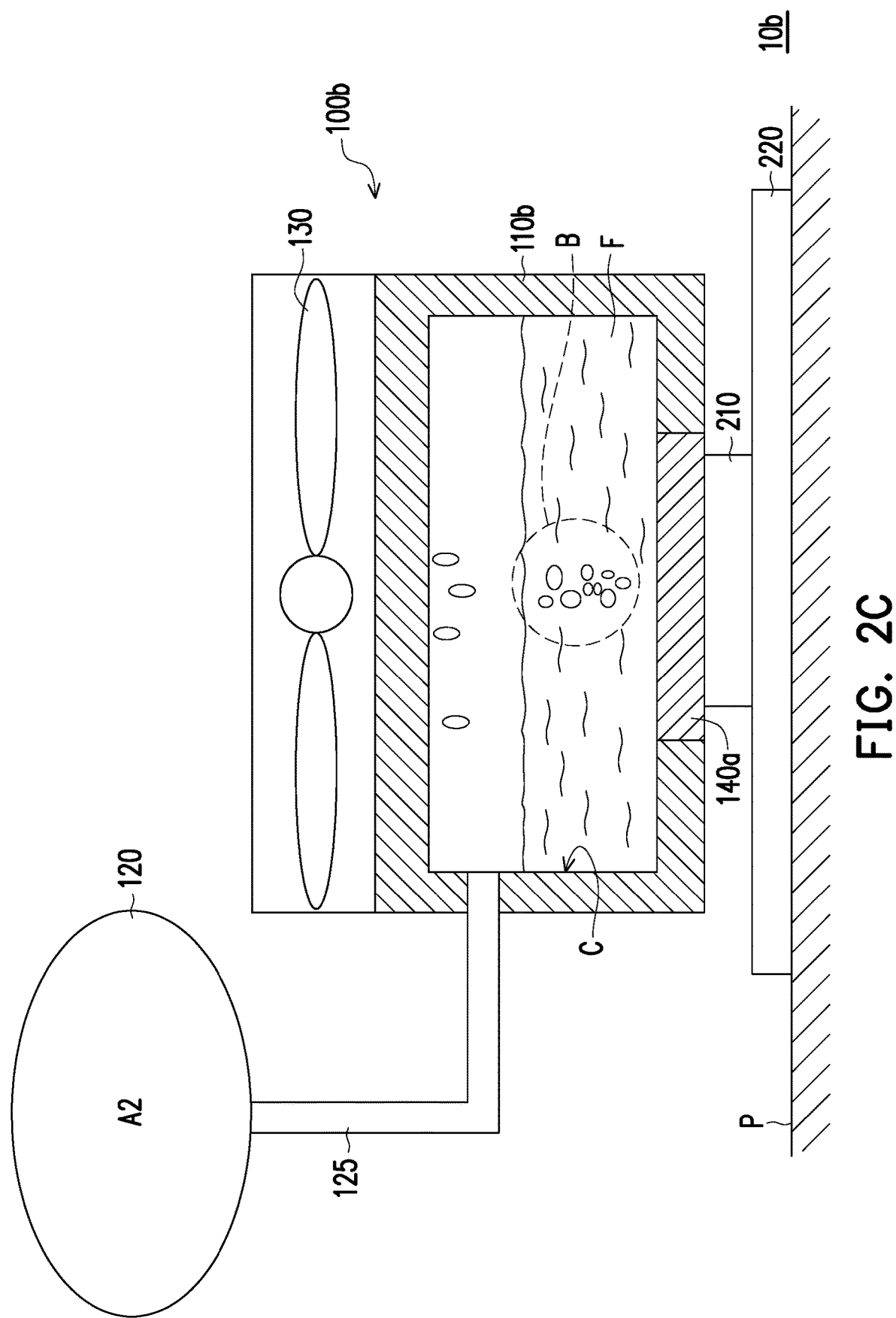

FIG. 2A is a schematic diagram of an electronic device according to another embodiment of the present invention. FIG. 2B and FIG. 2C are schematic diagrams of a buffer member expanding when a working fluid of a heat dissipation module in FIG. 2A is boiling and evaporating. Refer to FIG. 2A and FIG. 1A first, the electronic device 10b of the present embodiment is similar to the electronic device 10a in FIG. 1A. The difference between the two is as follows: the heat dissipation module 100b of the present embodiment further includes a heat transfer member 140a, which is arranged in the heat dissipation portion 110b and is in contact with the working fluid F, wherein the heat transfer member 140a, for example, is a boiling block or a boiling-assisting metal, but is not limited thereto.

More specifically, the heat dissipation portion 110b of the present embodiment has a opening 115b, and the heat transfer member 140a is located in the opening 115b.

Preferably, the heat transfer member 140a is immersed in a sol-gel solution of silicon dioxide ($SiO_2$) for 30 seconds by utilizing a sol-gel dip plating method and dried under low temperature in a dry environment. The surface material is transformed into cuprous oxide ($Cu_2O$), so that the heat transfer member 140a has a hydrophilic surface S1 (regarded as the first surface of the heat transfer member 140a) in contact with the working fluid F. Preferably, the contact surface of the heat transfer member 140a and the heating component 210 is a flat surface S3 (regarded as the second surface of the heat transfer member 140a) to enlarge the contact area between the heat transfer member 140a and the heating component 210 and effectively improve the heat dissipation area.

Refer to FIG. 2A, FIG. 2B and FIG. 2C at the same time, when heat produced by the heating component 210 is transferred to the working fluid F by the heat transfer member 140a, the working fluid F can be heated to boil to produce the bubbles B. At this moment, the capacity of the buffer member 120 is expanded from the first capacity A1 to the second capacity A2, so that the pressure in the containing portion C is kept unchanged, i.e. still maintained at one atmospheric pressure. Then, the characteristic that the working fluid F (such as liquid water) can rise when being vaporized is utilized to enable the heat dissipation module 100a to automatically bring the heat upward, moreover, the heat is condensed above and turned into liquid to flow back, completing self-circulation, and thus a heat dissipation effect is achieved. Thereby, the energy for bringing heat upward is saved, and can be regarded as a kind of passive green energy. In addition, in the boiling process of the working fluid F, the hydrophilic surface S1 in direct contact with the working fluid F can increase the efficiency of the process of vaporizing the working fluid F, thereby increasing the heat dissipation capability of the heat dissipation module 100b. In short, the arrangement of the heat transfer member 140a of the present embodiment can increase the boiling capability of the working fluid F.

Figure 3A:
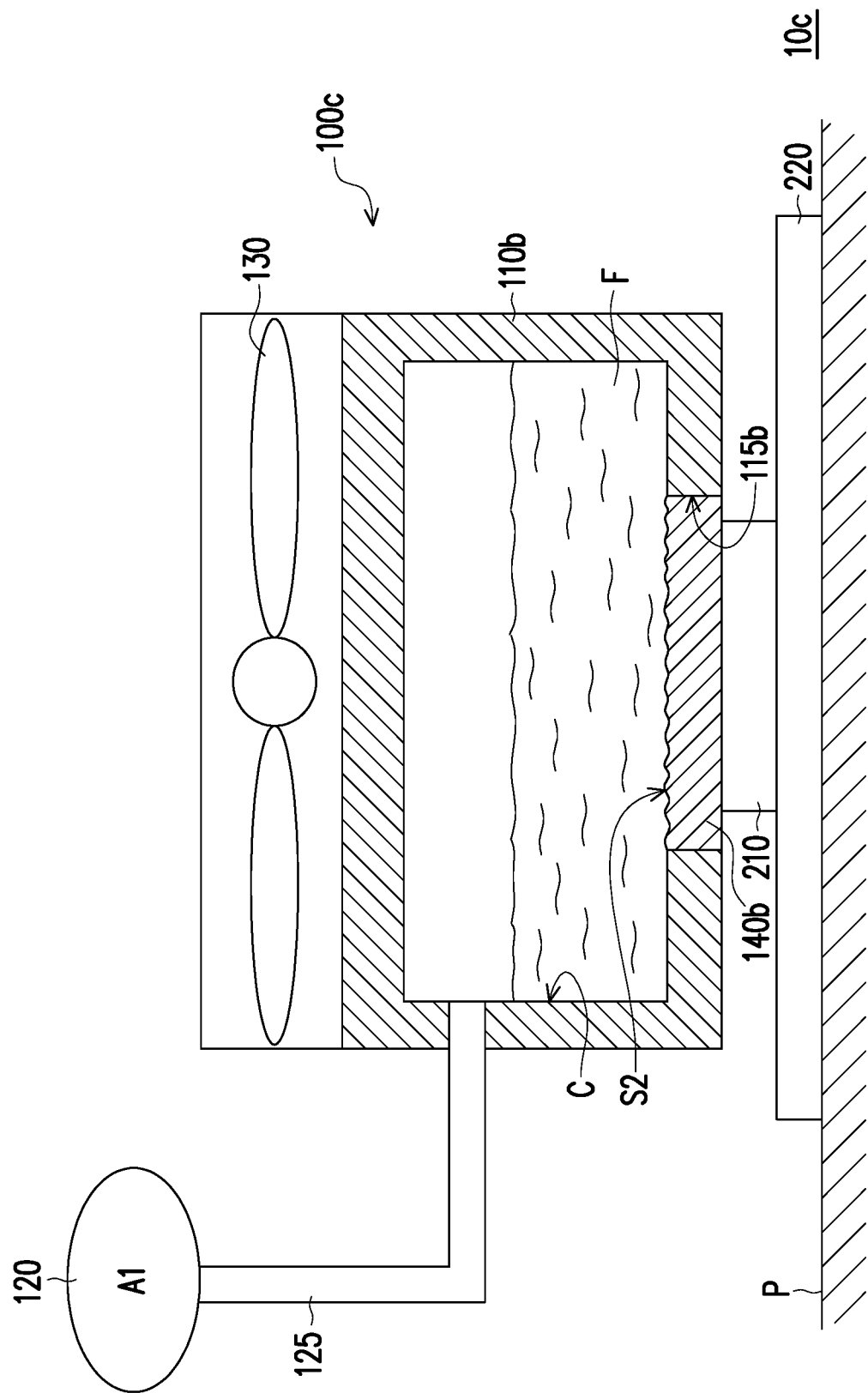
FIG. 3A a schematic diagram of an electronic device according to yet another embodiment of the present invention.

FIG. 3A a schematic diagram of an electronic device according to yet another embodiment of the present invention. Refer to both FIG. 3A and FIG. 2A, the electronic device 10c of the present embodiment is similar to the electronic device 10b in FIG. 2A. The difference between the two is that the heat transfer member 140b of the heat dissipation module 100c of the present embodiment has a rough surface S2 in contact with the working fluid F. By utilizing a sintered structure, the surface of the heat transfer member 140b forms the rough surface S2, so that the working fluid F can be more easily boiled under high temperature.

Figure 3B:
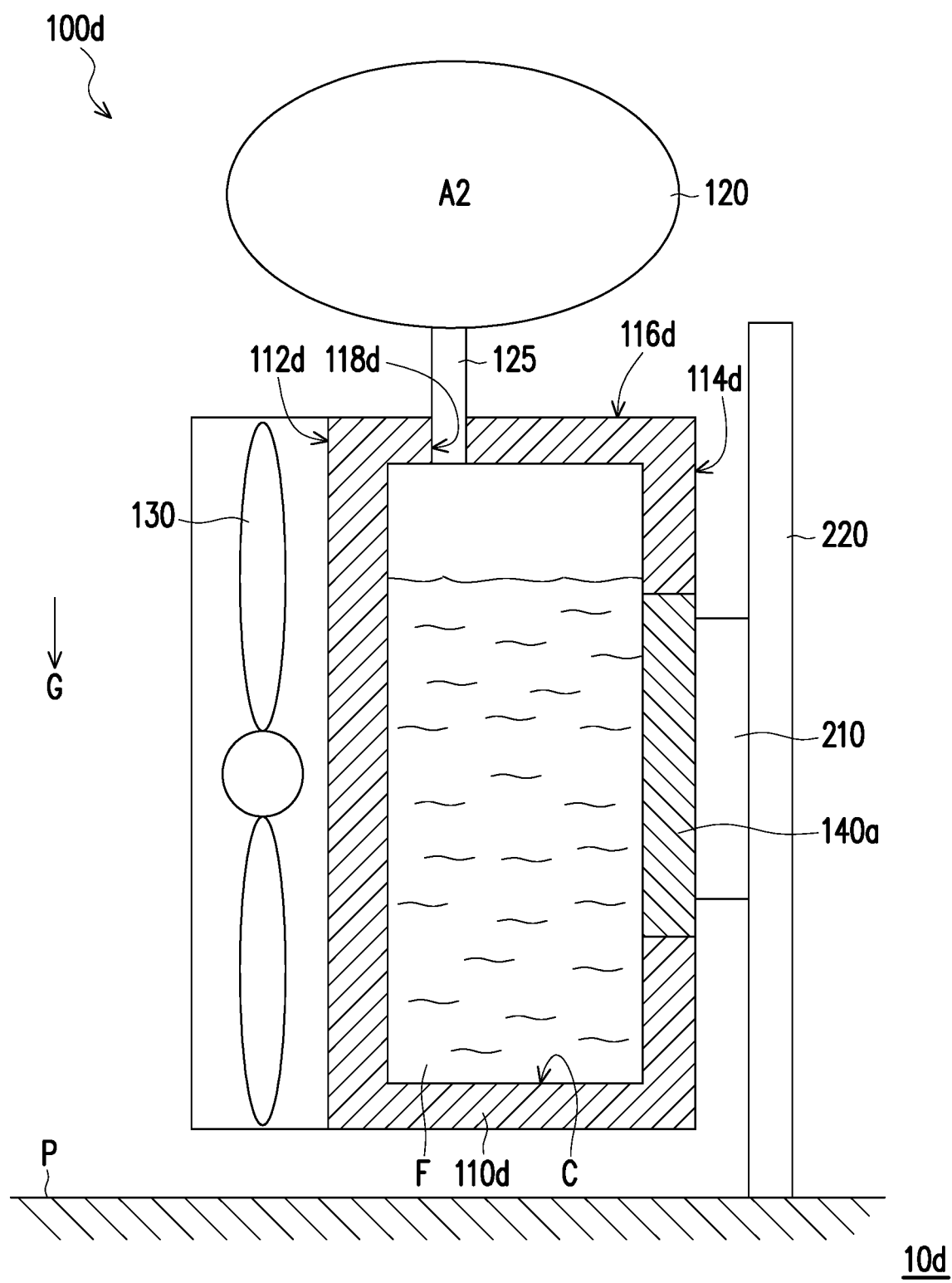
FIG. 3B is a schematic diagram of an electronic device according to still another embodiment of the present invention.

FIG. 3B is a schematic diagram of an electronic device according to still another embodiment of the present invention. Refer to both FIG. 3B and FIG. 2A, the electronic device 10d of the present embodiment is similar to the electronic device 10b in FIG. 2A. The difference between the two is that the first surface 112d and the second surface 114d of the heat dissipation portion 110d of the present embodiment are substantially perpendicular to the horizontally arranged surface P. That is, under the condition of enough space, the buffer member 120 can be arranged parallel to the gravity direction G, so that the working fluid F can smoothly flow back, wherein the level of the working fluid F is required to immerse the extended area of the heating component 210. At this point, the heat transfer member 140a is required to take into consideration both the locking torque and the heat transfer effect. Preferably, the thickness of the heat transfer member 140b does not exceed 3 mm.

Based on the above, in the design of the heat dissipation module of the present invention, the buffer member is connected to the containing portion of the heat dissipation portion, and when the working fluid is heated, the buffer member is expanded from the first capacity to the second capacity to maintain a constant pressure within the containing portion. That is, the pressure in the containing portion is kept unchanged before and after the working fluid is heated. Thus, the problem of boiling point increasing of the working fluid as the result of drastic pressure change during vaporization can be mitigated, thereby increasing the heat dissipation efficiency of the heat dissipation module of the present invention. In addition, the electronic device which adopts the heat dissipation module of the present invention can have better efficiency and reliability as well.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A heat dissipation module, comprising:
   a heat dissipation portion, having a containing portion;
   a working fluid, contained in the containing portion;
   a buffer member, connected to the containing portion, wherein when the working fluid is heated, the buffer member is expanded to extract a plurality of bubbles from the containing portion to a space inside the buffer member when the working fluid is heated to boil to maintain a constant pressure within the containing portion; and
   a heat dissipation component, disposed on the heat dissipation portion, and the heat dissipation component comprises a fan without a fin.

2. The heat dissipation module according to claim 1, further comprising:
   a heat transfer member, disposed in the heat dissipation portion and being in contact with the working fluid.

3. The heat dissipation module according to claim 2, wherein the heat dissipation portion has an opening and the heat transfer member is located in the opening.

4. The heat dissipation module according to claim 2, wherein the heat transfer member has a hydrophilic surface in contact with the working fluid.

5. The heat dissipation module according to claim 2, wherein the heat transfer member has a rough surface in contact with the working fluid.

6. The heat dissipation module according to claim 1,
   wherein the heat dissipation portion has a first surface and a second surface opposite to each other, and the heat dissipation component is located on the first surface.

7. The heat dissipation module according to claim 1, wherein the heat dissipation portion has a first surface and a second surface opposite to each other, a peripheral surface connecting the first surface and the second surface, and an opening, wherein the opening is located in the peripheral surface, and the buffer member is connected to the containing portion via the opening.

8. The heat dissipation module according to claim 7, further comprising:
a tube, connecting the buffer member and the opening.

9. The heat dissipation module according to claim 7, wherein a distance from a top surface of the working fluid to a horizontally arranged surface has a first vertical height, a distance from the opening located in the peripheral surface to the horizontally arranged surface has a second vertical height, and the second vertical height is greater than the first vertical height.

10. The heat dissipation module according to claim 9, wherein the first surface and the second surface of the heat dissipation portion are parallel to the horizontally arranged surface.

11. The heat dissipation module according to claim 9, wherein the first surface and the second surface of the heat dissipation portion are perpendicular to the horizontally arranged surface.

12. The heat dissipation module according to claim 1, wherein a boiling point of the working fluid is between 50° C. to 80° C.

13. The heat dissipation module according to claim 1, wherein, the working fluid is water.

14. An electronic device, comprising:
a mainboard;
at least one heating component, arranged on the mainboard; and
a heat dissipation module, arranged on the mainboard and being in contact with the heating component, the heat dissipation module comprising:
a heat dissipation portion, having a containing portion;
a working fluid, contained in the containing portion;
a buffer member, connected to the containing portion, wherein when heat produced by the heating component is transferred to the heat dissipation module, the working fluid is heated and the buffer member is expanded to extract a plurality of bubbles from the containing portion to a space inside the buffer member when the working fluid is heated to boil to maintain a constant pressure within the containing portion; and
a heat dissipation component, disposed on the heat dissipation portion, wherein the heat dissipation component comprises a fan without a fin.

15. The electronic device according to claim 14, wherein the heat dissipation module further comprises:
a heat transfer member, disposed in the heat dissipation portion and being in contact with the working fluid, wherein a first surface of the heat transfer member contacts the working fluid, and a second surface of the heat transfer member contacts the heating component.

16. The electronic device according to claim 15, wherein a contact surface of the heat transfer member and the heating component is a flat surface.

17. The electronic device according to claim 14, wherein the heat dissipation portion is located between the heat dissipation component and the heating component.

18. The electronic device according to claim 14, wherein the heating component is a central processing unit or a graphic processing unit.

* * * * *